(12) United States Patent
Kumazawa et al.

(10) Patent No.: US 11,006,559 B2
(45) Date of Patent: May 11, 2021

(54) COMPONENT MOUNTING MACHINE (71) Applicant: FUJI CORPORATION, Chiryu (JP)

(72) Inventors: Hideyuki Kumazawa, Okazaki (JP); Shingo Miyazaki, Chita-gun (JP)

(73) Assignee: FUJI CORPORATION, Chiryu (JP)

( * ) Notice: Subject to any disclaimer, the term of this patent is extended or adjusted under 35 U.S.C. 154(b) by 250 days.

(21) Appl. No.: 16/339,397

(22) PCT Filed: Oct. 12, 2016

(86) PCT No.: PCT/JP2016/080207
§ 371 (c)(1),
(2) Date: Apr. 4, 2019

(87) PCT Pub. No.: WO2018/069990
PCT Pub. Date: Apr. 19, 2018

(65) Prior Publication Data
US 2020/0045860 A1 Feb. 6, 2020

(51) Int. Cl.
*H05K 13/04* (2006.01)
*H05K 13/08* (2006.01)

(52) U.S. Cl.
CPC ....... *H05K 13/0406* (2018.08); *H05K 13/082* (2018.08); *H05K 13/0408* (2013.01); *Y10T 29/53174* (2015.01)

(58) Field of Classification Search
CPC ............. H05K 13/082; H05K 13/0406; H05K 13/0408; Y10T 29/53174
See application file for complete search history.

(56) References Cited

U.S. PATENT DOCUMENTS

| 4,680,523 A | 7/1987 | Goumas et al. |
| 5,945,798 A * | 8/1999 | Stagnitto ............... B25J 9/1612 294/110.1 |
| 2016/0073511 A1 | 3/2016 | Watanabe |

FOREIGN PATENT DOCUMENTS

JP 2009-200532 A 9/2009

OTHER PUBLICATIONS

International Search Report dated Jan. 17, 2017 in PCT/JP2016/080207 filed on Oct. 12, 2016.

* cited by examiner

*Primary Examiner* — Livius R. Cazan
(74) *Attorney, Agent, or Firm* — Oblon, McClelland, Maier & Neustadt, L.L.P.

(57) ABSTRACT

A component transfer device includes a detector configured to detect a rotation angle of a driving motor that moves a pair of gripping sections, or a position of the gripping sections, and a motor control section configured to perform position feedback control of the driving motor based on a detection signal of the detector and a position command signal from the transfer control device. A transfer control device is provided with a torque monitoring section configured to monitor a value of a command torque applied to the driving motor from the motor control section, and a gripping state determining section configured to determine that there was a change in a gripping state of the component when, with the pair of gripping sections in a state gripping the component, the command torque monitored by the torque monitoring section drops to a value smaller than a first threshold value.

5 Claims, 7 Drawing Sheets

COMPONENT MOUNTING MACHINE

TECHNICAL FIELD

The present application relates to a component mounting machine.

BACKGROUND ART

Patent literature 1 discloses an electronic component holding device that grips an electronic component with a pair of holding claws and conveys the held electronic component.

CITATION LIST

Patent Literature

Patent literature 1: JP-A-2009-200532

BRIEF SUMMARY

Technical Problem

With the technology disclosed in patent literature 1 above, an electronic component holding device, when conveying a component, is unable to detect a change in the holding state of the component by the pair of holding claws.

An object of the present disclosure is to provide a component mounting machine that detects a change in a gripping state of a component.

Solution to Problem

A component mounting machine of the present disclosure is provided with a component transfer device configured to hold a supplied component and to mount the component onto a conveyed board; and a transfer control device configured to control the component transfer device. The component transfer device is provided with a pair of gripping sections configured to grip the component by moving in a direction towards each other, a driving motor configured to move the pair of gripping sections, a detector configured to detect a rotation angle of the driving motor or a position of the pair of the gripping sections, and a motor control section configured to perform position feedback control of the driving motor based on a detection signal of the detector and a position command signal from the transfer control device. The transfer control device is provided with a torque monitoring section configured to monitor a value of a command torque applied to the driving motor from the motor control section, and a gripping state determining section configured to determine that there was a change in a gripping state of the component in a case in which, with the pair of gripping sections in a state gripping the component, the command torque monitored by the torque monitoring section drops to a value smaller than a first threshold value.

According to a component mounting machine of the present disclosure, by the transfer control device monitoring a command torque, it is possible the detect that there has been a change in the gripping state of the component by the pair of gripping sections. Thus, with the component mounting machine, it is possible to detect errors that occur during work of mounting components at an early stage.

DESCRIPTION OF EMBODIMENTS

Configuration of Component Mounting Machine 1

Figure 1:
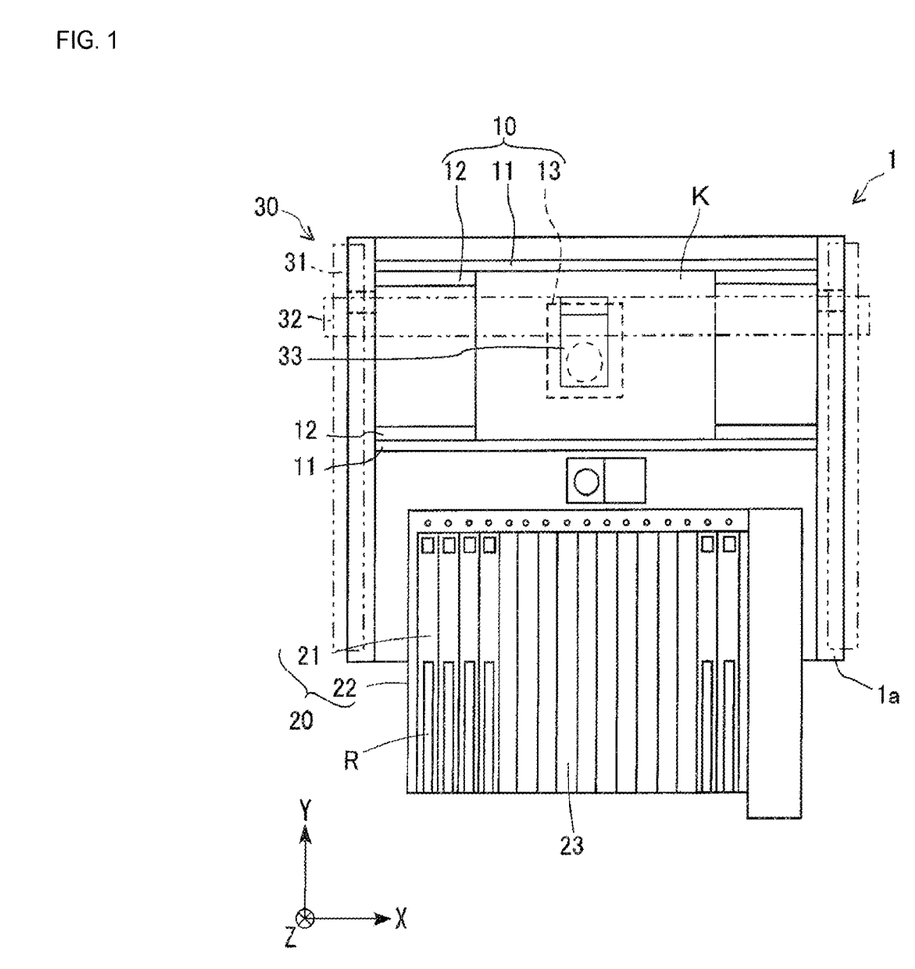
FIG. 1 is a plan view of a component mounting machine that is an embodiment of the present disclosure.

As an embodiment of the present disclosure, a component mounting machine is described below with reference to the figures. First, the configuration of component mounting machine 1 is described with reference to FIGS. 1 and 2. As shown in FIG. 1, component mounting machine 1 is provided mainly with board conveyance device 10, component supply device 20, component transfer device 30, and transfer control device 100. Note that, in FIGS. 1 and 2, the direction in which board K is conveyed is the X-axis direction, a horizontal direction perpendicular to the X axis is the Y-axis direction, and a vertical direction perpendicular to the X-axis direction and the Y-axis direction is the Z-axis direction.

Also provided are a pair of guide rails 11, a pair of conveyor belts 12, and clamp device 13. Pair of guide rails 11 extend in the X-axis direction and are parallel to each other. Conveyor belts 12 are endless members on which board K is loaded, and pair of conveyor belts 12 is provided in a revolvable manner on the inside of guide rails 11 facing each other. Clamp device 13 is arranged between the pair of guide rails 11 and below the component mounting position set at a central portion in the X-axis direction. Board K, after being conveyed to the component mounting position by the pair of conveyor belts while being guided by the pair of guide rails 11, is positioned and fixed at the component mounting position by clamp device 13, and when mounting of component P is complete, the board K is unloaded outside of component mounting machine 1.

Component supply device 20 is provided with feeders 21 and pallet 22. Feeder 21 exchangeably holds reel R in a rear section of the feeder (down in FIG. 1). Carrier tape containing multiple components P is wound on reel R. Pallet 22 is formed in a substantially rectangular shape. Multiple slots 23 extending in the Y-axis direction are formed in an upper surface of pallet 22. Feeders 21 are removably mounted onto positions formed by these multiple slots 23. Component supply device 20 pulls out carrier tape from reel R at a specified pitch to sequentially index components P to the front of feeder 21 (up in FIG. 1).

Component transfer device 30 is mainly provided with pair of guide members 31, Y-axis slider 32, X-axis slider 33, raising and lowering member 34, and rotation member 35. Pair of guide members 31 is fixed in the Y-axis direction at both sides of base 1a of component mounting machine 1 in the X-axis direction. Y-axis slider 32 is a long member extending in the X-axis direction, and is supported on pair of guide members 31 to be movable in the Y-axis direction. X-axis slider 33 is supported on Y-axis slider 32 to be movable in the X-axis direction. Raising and lowering member 34 is supported on X-axis slider 33 to be movable in the Z-axis direction. Rotation member 35 is supported to be rotatable around an axis parallel to the Z axis on a bottom surface of raising and lowering member 34. Component gripping device 40 that grips component P supplied by component supply device 20 is provided on the bottom surface of rotation member 35.

Component gripping device 40 is mainly provided with main body section 41, feed screw shaft 42, driving motor 43, and pair of gripping sections 44a and 44b. Main body section 41 is a long member extending in the horizontal direction. Feed screw shaft 42 is a rod-type member housed inside main body member 41. Right screw 42a is provided on an outer circumferential surface of feed screw shaft 42 at a position towards one end in the lengthwise direction (the right side in FIG. 2), and left screw 42b is provided on an outer circumferential surface of feed screw shaft 42 at a position towards the other end in the lengthwise direction (the left side in FIG. 2). Driving motor 43 is provided at an end of feed screw shaft 42 in the lengthwise direction, and rotates feed screw shaft 42.

Figure 2:
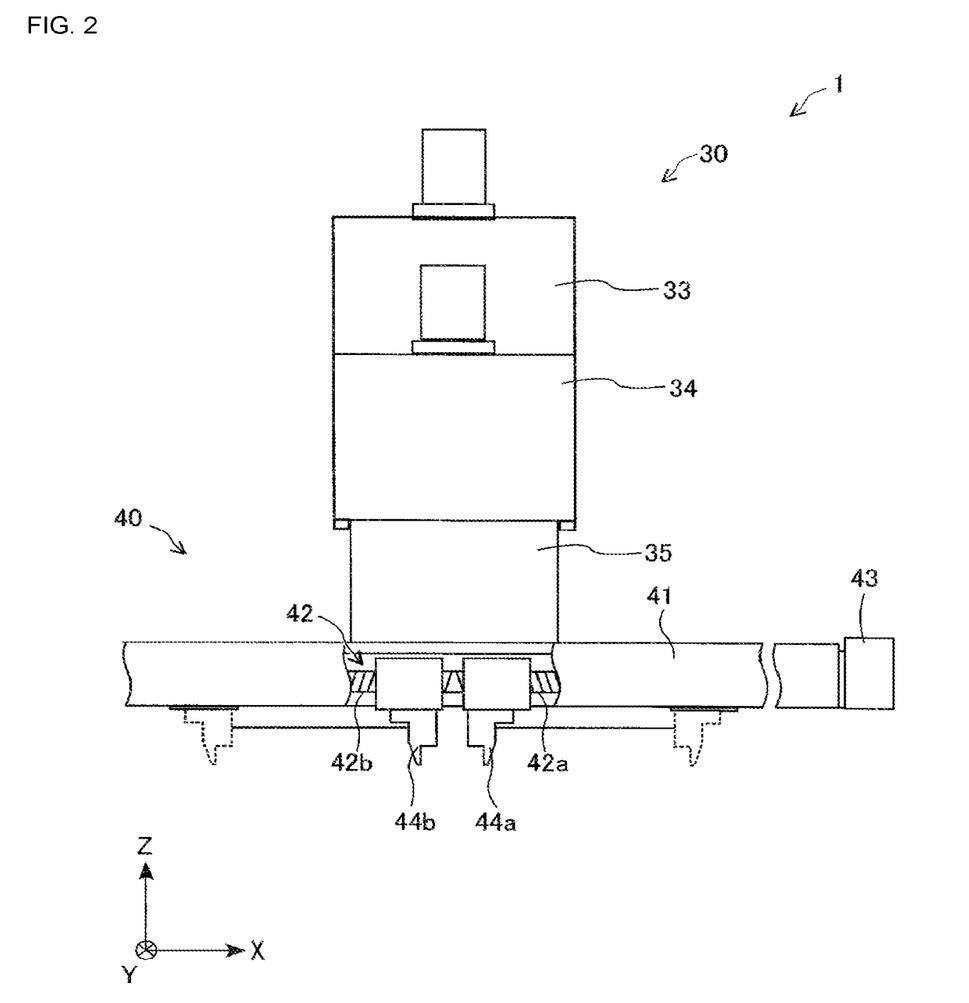
FIG. 2 is a side view of the component mounting machine from the Y-axis direction.

The pair of gripping sections 44a and 44b are provided to protrude down from main body section 41. Gripping section 44a is movably mounted on right screw 42a and gripping section 44b is movably mounted on left screw 42b. The pair of gripping sections 44a and 44b are moved towards or away from the each other by the rotation of feed screw shaft 42 that is rotated by the driving of driving motor 43.

Figure 3:
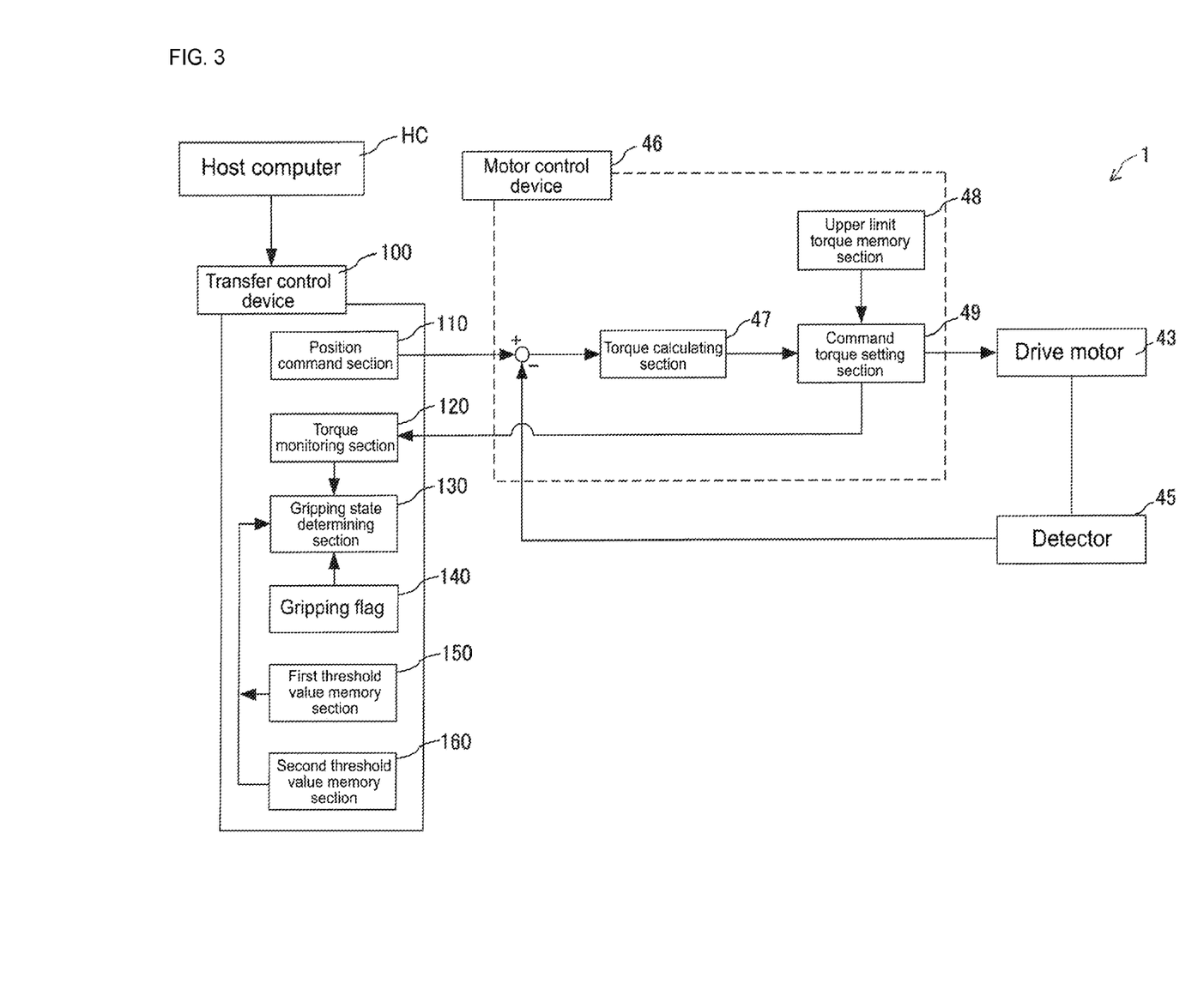
FIG. 3 is a block diagram of the component mounting machine.

As shown in FIG. 3, component transfer device 30 is further provided with detector 45 and motor control section 46. Detector 45 is an encoder for detecting the rotation of driving motor 43 and the position of the pair of gripping sections 44a and 44b is known by the encoder detecting the rotation angle of driving motor 43. Motor control section 46 performs position feedback control of driving motor 43 based on detection signals of detector 45 and position command signals from transfer control device 100. The pair of gripping sections 44a and 44b move to the target positions commanded by transfer control device 100 by the position feedback control of driving motor 43.

Further, motor control section 46 is provided with torque calculating section 47, upper limit torque memory section 48, and command torque setting section 49. Torque calculating section 47 calculates a torque required for the pair of gripping sections 44a and 44b to reach the target positions based on feedback signals received from detector 45 and position command signals received from transfer control device 100. Specifically, torque calculating section 47 calculates the required torque based on the current position of the pair of gripping sections 44a and 44b indicated by feedback signals received from detector 45 and the deviation from the target positions indicated by the position command signals received from transfer control device 100.

Upper limit torque memory section 48 memorizes an upper limit value of the command torque (also referred to as "torque upper limit value") applied to driving motor 43 from motor control section 46. The torque upper limit value is set according to the strength of component P to be gripped by the pair of gripping sections 44a and 44b. Command torque setting section 49 sets the command torque to be applied to driving motor 43 from motor control section 46. If the value of the torque calculated by torque calculating section 47 is equal to or less than the torque upper limit value, command torque setting section 49 sets the calculated torque value to the command torque. On the other hand, if the calculated torque value exceeds the torque upper limit value, motor control section 46 corrects the command torque such that the command torque matches the torque upper limit value.

Here, the interval between the pair of gripping sections 44a and 44b at the target positions based on the position command signals received from transfer control device 100 is set to be smaller than the interval between the pair of gripping sections 44a and 44b when in a state gripping component P. Thus, component P is reliably gripped by the pair of gripping sections 44a and 44b. On the other hand, if an excessive force is applied by the pair of gripping sections 44a and 44b to component P, component P may be damaged. Thus, motor control section 46, if the calculated torque value exceeds the torque upper limit value, corrects the command torque value to the torque upper limit value. Accordingly, damage to the component P gripped by the pair of gripping sections 44a and 44b due to the gripping force of the pair of gripping sections 44a and 44b is curtailed.

Transfer control device 100 performs overall control of component transfer device 30. Transfer control device 100 is connected to host computer HC such that communication is possible and performs control of component transfer device 30 in accordance with commands from host computer HC. Items such as a board control device (not shown) that performs control of board conveyance device 10, and a supply control device (not shown) that performs control of component supply device 20 are connected to host computer HC such that communication is possible. The board control device and the supply control device perform control of board conveyance device 10 and component supply device 20 in accordance with commands from host computer HC.

Transfer control device 100 is mainly provided with position command section 110, torque monitoring section 120, gripping state determining section 130, gripping flag 140, first threshold value memory section 150, and second threshold value memory section 160. Position command section 110 sends position command signals to torque calculating section 47 based on commands from host computer HC. Torque monitoring section 120 monitors a command torque value set by command torque setting section 49. Gripping state determining section 130 determines whether there has been a change in the gripping state of component P by the pair of gripping sections 44a and 44b based on the command torque monitored by torque monitoring section 120.

Gripping flag 140 is a flag indicating whether the pair of gripping sections 44a and 44b is gripping a component P. When the pair of gripping sections 44a and 44b are gripping the component P, gripping flag 140 is ON, and when the pair of gripping sections 44a and 44b are not gripping the component P, gripping flag 140 is OFF. First threshold value memory section 150 memorizes first threshold value Th1 that is a torque value smaller than the torque upper limit value, and second threshold value memory section 160 memorizes second threshold value Th2 that is a torque value smaller than first threshold value Th1.

Driving Motor Control Processing

Driving motor control processing performed by motor control section 46 is described next with reference to the flowchart shown in FIG. 4. Driving motor control processing is performed when component P is gripped by the pair of gripping sections 44a and 44b, and then conveyed to and mounted on board K.

Figure 4:
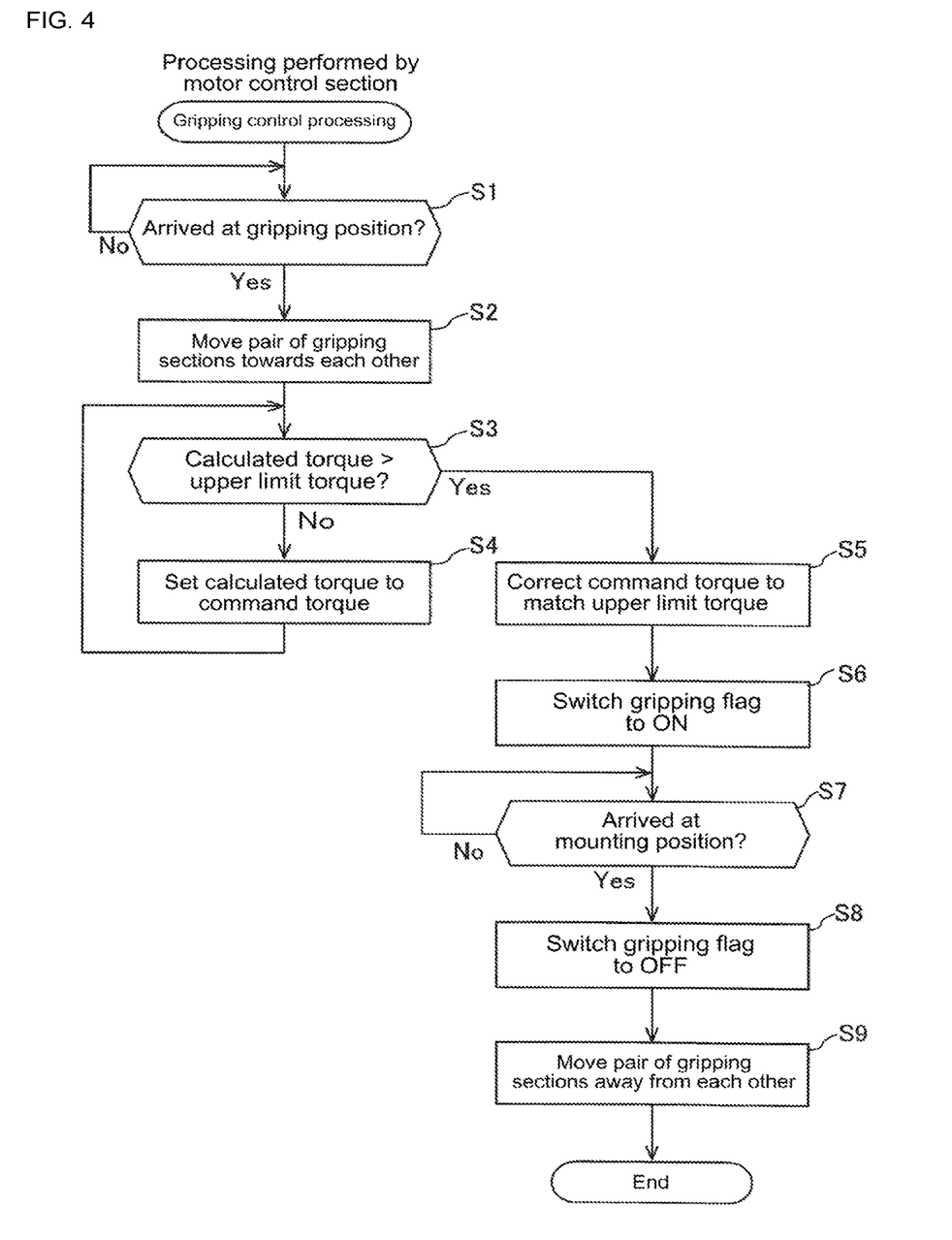
FIG. 4 is a flowchart showing driving motor control processing performed by a motor control section.

As shown in FIG. 4, in driving motor control processing, first, it is determined whether the pair of gripping sections 44a and 44b have reached the gripping position of component P (S1). If the pair of gripping sections 44a and 44b have not reached the gripping position of component P (S1: no), motor control section 46 repeatedly performs the processing of S1. On the other hand, if the pair of gripping sections 44a and 44b have reached the gripping position of component P (S1: yes), motor control section 46 performs drive control of driving motor 43 such that the pair of gripping sections 44a and 44b move closer to each other (S2).

After the processing of S2, it is determined whether the torque calculated by torque calculating section 47 has exceeded the torque upper limit value. If the calculated torque is equal to or less than the torque upper limit value (S3: no), command torque setting section 49 sets the calculated torque value to the command torque (S4), and motor control section 46 applies the command torque that was set to driving motor 43. Motor control section 46, completing the processing of S4, returns to the processing of S3. Then, in the processing of S3, if the calculated torque exceeds the torque upper limit value (S3: yes), command torque setting section 49 corrects the command torque so as to match the torque upper limit value (S5), and applies the corrected command torque to driving motor 43. Also, motor control section 46 determines that component P is in a state being held by the pair of gripping sections 44a and 44b, so switches the gripping flag to ON (S6).

In the processing of S7, motor control section 46 determines whether the pair of gripping sections 44a and 44b has reached the mounting position of component P onto board K (S7). If the mounting position has not been reached (S7: no), motor control section 46 repeats the processing of S7. On the other hand, when the pair of gripping sections 44a and 44b has reached the mounting position (S7: yes), motor control section 46 switches gripping flag 140 to OFF (S8), performs driving control of driving motor 43 such that the pair of gripping sections 44a and 44b separate from each other (S9), then ends processing.

Gripping State Control Processing

Gripping state monitoring processing performed by transfer control device 100 is described next with reference to FIGS. 5 to 7. Gripping state monitoring processing is performed when component P is in a state being gripped by gripping sections 44a and 44b.

Figure 5:
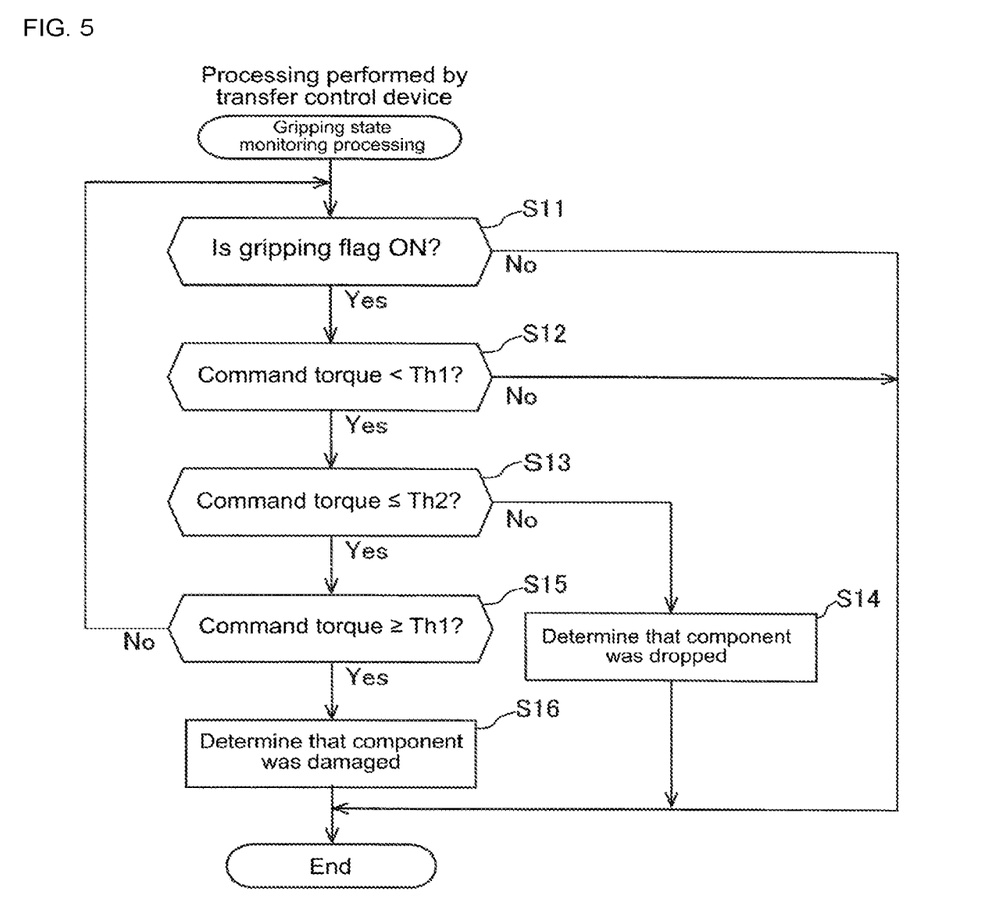
FIG. 5 is a flowchart showing gripping state monitoring processing performed by a transfer control device.

As shown in FIG. 5, during gripping state monitoring processing, transfer control device 100, first, determines whether gripping flag 140 is ON (S11). If gripping flag 140 is OFF (S11: no), transfer control device 100 determines that the pair of gripping sections 44a and 44b is not currently gripping a component P, so ends processing. On the other hand, if gripping flag 140 is ON (S11: yes), transfer control device 100 determines whether the command torque has dropped to a smaller value than first threshold value Th1 (S12).

In the processing of S12, if the command torque is equal to or greater than first threshold value Th1 (S12: no), there has been no change in the gripping state of component P by the pair of gripping sections 44a and 44b, and transfer control device 100 determines that the component P is being appropriately gripped by the pair of gripping sections 44a and 44b. Thus, transfer control device 100 then ends processing.

On the other hand, if the command torque has dropped to a value smaller than first threshold value Th1 (S12: yes), transfer control device 100 determines that the gripping state of the component P by the pair of gripping sections 44a and 44b has changed, and proceeds to processing of S13.

Figure 6:
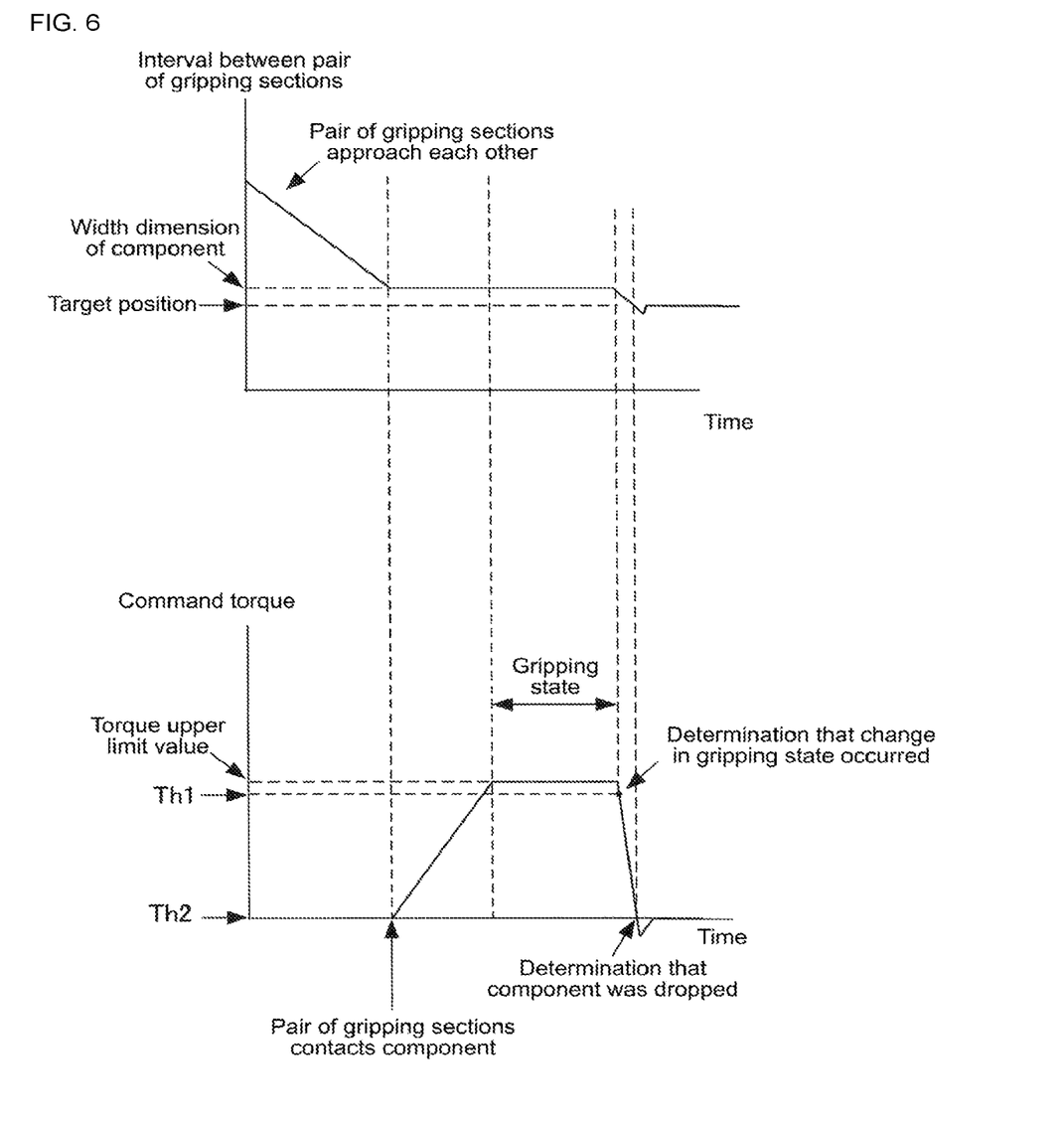
FIG. 6 is a graph showing a relationship between an interval between the pair of gripping sections and command torque, with the change in the interval between the pair of gripping sections and the change in the command torque shown in a case in which the component being gripped is dropped.
Figure 7:
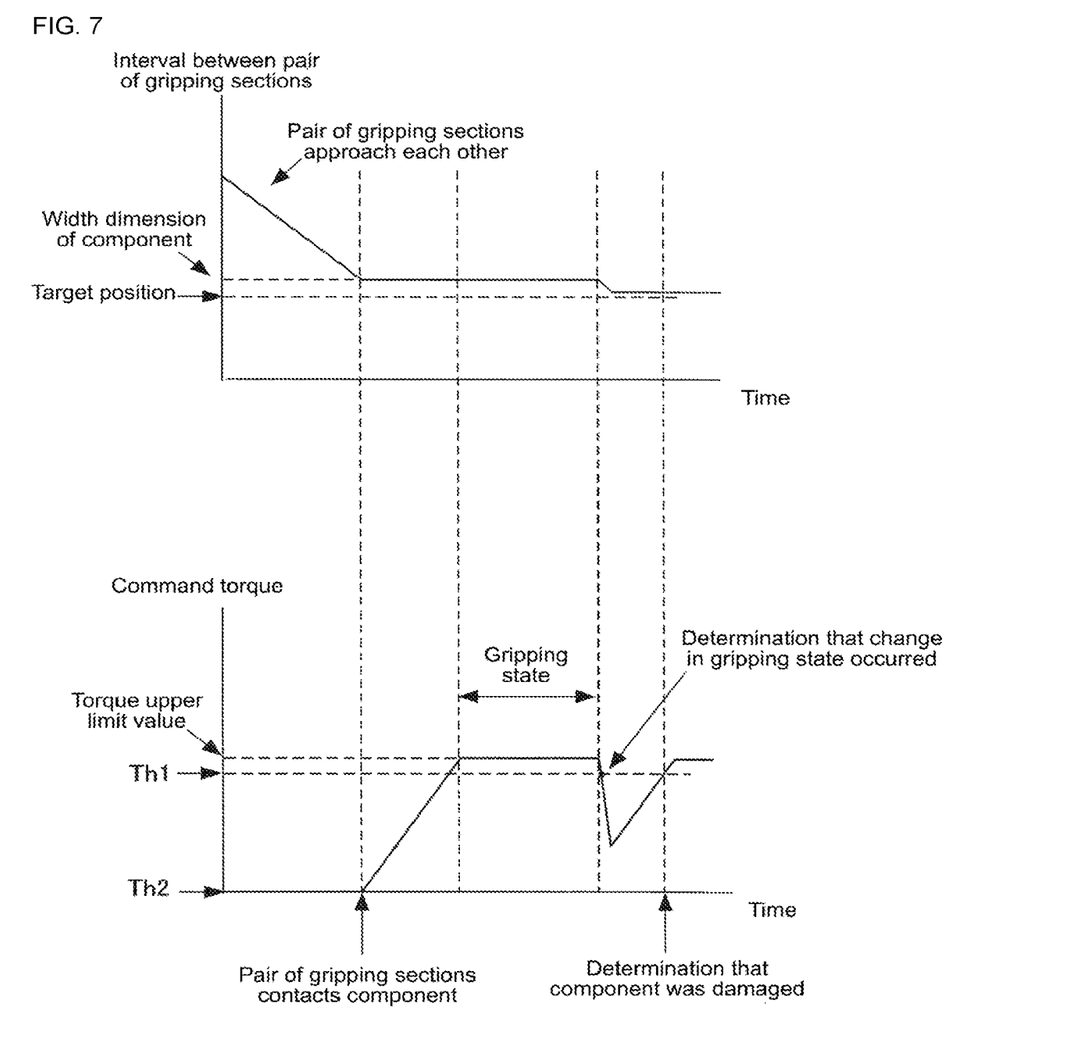
FIG. 7 is a graph showing a relationship between an interval between the pair of gripping sections and command torque, with the change in the interval between the pair of gripping sections and the change in the command torque shown in a case in which the component being gripped is damaged.

Here, as shown in FIGS. 6 and 7, when the pair of gripping sections 44a and 44b approach each other such that the interval between the pair of gripping sections 44a and 44b becomes the same as the width dimension of the component P, the pair of gripping sections 44a and 44b contact component P and the command torque begins to increase. Then, when the command torque reaches the torque upper limit value, the value of the command torque becomes stable. Further, if no problems occur with the gripping state of the component P by the pair of gripping sections 44a and 44b, the command torque will remain at the torque upper limit value until the pair of gripping sections 44a and 44b reach the mounting position.

In contrast, as shown in FIG. 6, when a component P gripped by pair of gripping sections 44a and 44b is dropped, the command torque drops to a value smaller than second threshold value Th2. Here, in gripping state monitoring processing, transfer control device 100 determines that component has been dropped if the command torque drops below second threshold Th2. Note that, due to component P being dropped, the pair of gripping sections 44a and 44b reach the target position based on the position command signals from transfer control device 100, so movement of the pair of gripping sections 44a and 44b stops.

In this manner, in component mounting machine 1, transfer control device 100 determines that component P has been dropped more quickly than a case in which is determines that the component P has been dropped because the pair of gripping sections 44a and 44b have contacted each other.

Also, if the component P being gripped by the pair of gripping sections 44a and 44b is damaged during the process of conveying component P and the width dimension of the component P becomes smaller, the command torque drops. However, there are cases in which, depending on the damage condition of the component P, the damaged component P remains gripped by the pair of gripping sections 44a and 44b due to the interval between the pair of gripping sections 44a and 44b becoming smaller.

Here, as shown in FIG. 7, transfer control device 100, during gripping state monitoring processing, determines that component P has been damaged in a case in which the command torque that reached the torque upper limit value dropped to a value smaller than the first threshold value Th1, but then increased to the first threshold value Th1 again without reaching the second threshold value Th2. Accordingly, transfer control device 100, before mounting onto board K, is able to detect damage to component P, such that mounting a damaged component P onto the board K is avoided.

Returning to FIG. 5, descriptions of gripping state monitoring processing are continued. In the processing of S13, it is determined whether the command torque has reached second threshold value Th2 (S13). Further, when the command torque has reached second threshold value Th2 (S13: yes), transfer control device 100 determines that component P has been dropped (S14), then ends processing. Then, transfer control device 100 performs countermeasures such as performing a program for when a component P has been dropped.

On the other hand, if in the processing of S13 the command torque has not reached second threshold value Th2 (S13: no), it is determined whether the command torque has increased to reach first threshold value Th1 again (S15). Here, in a case in which the command torque has increased to first threshold value Th1 (S15: yes), transfer control device 100 determines that the component P has been damaged (S16), then ends processing. In this case, transfer control device 100 recognizes the component P being gripped as a defective component and rejects it, then performs countermeasures such as performing operation to grip a new component P.

Also, during processing of S15, if the command torque does not reach first threshold value Th1 (S15: no), processing returns to S11. In this manner, with gripping state monitoring processing, during processing of S12, in a case in which it is determined that there has been a change in the gripping state of the component P being gripped by pair of gripping sections 44a and 44b, transfer control device 100 monitors changes in the command torque. Accordingly, transfer control device 100 can understand details of a problem that occurs with component P. Also, transfer control device 100 can perform appropriate countermeasures with respect to the problem that occurred with component P.

As described above, in component mounting machine 1, transfer control device 100 is able to detect a change in the gripping state of a component P by monitoring the gripping state of the component P being gripped by pair of gripping sections 44a and 44b. Thus, component mounting machine 1 is able to detect errors that occur during work of mounting components P at an early stage.

Also, motor control section 46 corrects the command torque to be the torque upper limit value when the calculated torque exceeds the torque upper limit value. Thus, when a specified time has elapsed since pair of gripping sections 44a and 44b contact component P, a specified command torque is applied to drive motor 43. In this case, compared to a case in which there is variance in the command torque applied to driving motor 43 when gripping component P, a value close to the torque upper limit value is set as first threshold value Th1. As a result, transfer control device 100 is able to detect a change in the command torque quickly and to quickly discover when a change has occurred in the gripping state of the component P.

Other

The present disclosure has been described based on the above embodiments, but the present disclosure is not limited to the above-described embodiments and may be improved and modified in various ways without departing from the scope of the disclosure.

For example, in an embodiment above, an encoder is used as detector 45, and the position of the pair of griping sections 44a and 44b is known from the detection of the rotation angle of driving motor 43 by the encoder. However, the configuration is not limited to this, a linear scale may be used instead of an encoder, and the positions of the pair of gripping sections 44a and 44b may be detected using the linear scale.

Also, in an embodiment above, in a case in which the command torque drops from the torque upper limit value to a value smaller than first threshold value Th1 and then increases to first threshold value Th1 without reaching second threshold value Th2, component P is determined to be damaged, but the configuration is not limited to this. For example, transfer control device 100 may be set to determine that component P is damaged in a case in which, after dropping to a value smaller than first threshold value Th1, the command torque reaches the torque upper limit value, or, in a case in which the command torque reaches a third threshold value different to first threshold value Th1 and the torque upper limit value and larger than second threshold value Th2.

Effects

As described above, component mounting machine 1 of the present disclosure is provided with component transfer device 30 configured to hold a supplied component P and to mount the component P onto conveyed board K; and transfer control device 100 configured to control component transfer device 30. Component transfer device 30 is provided with pair of gripping sections 44a and 44b configured to grip the component P by moving in a direction towards each other, driving motor 43 configured to move the pair of gripping sections 44a and 44b, detector 45 configured to detect a rotation angle of driving motor 43 or a position of the pair of the gripping sections 44a and 44b, and motor control section 46 configured to perform position feedback control of driving motor 43 based on a detection signal of detector 45 and a position command signal from transfer control device 100.

Transfer control device 100 is provided with torque monitoring section 120 configured to monitor a value of a command torque applied to driving motor 43 from motor control section 46, and gripping state determining section 130 configured to determine that there was a change in a gripping state of the component P in a case in which, with the pair of gripping sections 44a and 44b in a state gripping the component P, the command torque monitored by torque monitoring section 120 drops to a value smaller than first threshold value Th1.

According to this component mounting machine 1, by transfer control device 100 monitoring a command torque, it is possible the detect that there has been a change in the gripping state of the component by the pair of gripping sections. Thus, component mounting machine 1 is able to detect errors that occur during work of mounting components P at an early stage.

In the above component mounting machine 1, motor control section 46, in a case in which the command torque based on the position feedback control exceeds the torque upper limit value set in accordance with the strength of the component P, applies the command torque corrected to the upper limit value to driving motor 43. In a state with component P being gripped by pair of gripping sections 44a and 44b, a command torque applied to driving motor 43 matches the torque upper limit value. Gripping state monitoring section 130 determines that there has been a change in the gripping state of component P in a case in which the command torque drops from the torque upper limit value to a value smaller than first threshold value Th1.

According to this component mounting machine 1, motor control section 46, in a case in which the command torque (calculated torque) based on the position feedback control exceeds the torque upper limit value, applies the command torque corrected to the upper limit value to driving motor 43. Accordingly, component mounting machine 1 curtails damage to the component P gripped by the pair of gripping sections 44a and 44b due to the gripping force of the pair of gripping sections 44a and 44b. Also, gripping state monitoring section 130 determines that there has been a change in the gripping state of component P in a case in which the command torque drops from the torque upper limit value to a value smaller than first threshold value Th1, therefore transfer control device 100 is able to detect a change in the gripping state of component P at an early stage.

With the above component mounting machine 1, the interval between the pair of gripping sections 44a and 44b at the target positions based on the position command signals is set to be smaller than the interval between the pair of gripping sections 44a and 44b when in a state gripping component P. According to this component mounting machine 1, component transfer device 30 is able to reliably grip component P using the pair of gripping sections 44a and 44b.

With the above component mounting machine 1, transfer control device 100, in a case in which the value of the command torque monitored by torque monitoring section 120 reaches second threshold value Th2 that is smaller than first threshold value Th1, determines that the component P being gripped by the pair of gripping sections 44a and 44b has been dropped. According to this component mounting machine 1, transfer control device 100 is able to detect at an early stage that component P gripped by gripping sections 44a and 44b has been dropped.

With the above component mounting machine 1, transfer control device 100, in a case in which the value of the command torque monitored by torque monitoring section 120 drops to a value smaller than first threshold value Th1 and then increases without reaching second threshold value Th2, determines that the component P being gripped by the pair of gripping sections 44a and 44b has been damaged. According to this component mounting machine 1, transfer control device 100 is able to detect at an early stage that component P gripped by gripping sections 44a and 44b has been damaged.

REFERENCE SIGNS LIST

1: component mounting machine;
30: component transfer device;
43: driving motor;
44a, 44b: gripping section;
45: detector;
46: motor control section;
100: transfer control device;
120: torque monitoring section;
130: gripping state determining section;
K: board;
P: component;
Th1: first threshold;
Th2: second threshold

The invention claimed is:

1. A component mounting machine comprising:
a component transfer device configured to hold a supplied component and to mount the component onto a conveyed board; and
a transfer control device configured to control the component transfer device,
wherein
the component transfer device is provided with
a pair of gripping sections configured to grip the component by moving in a direction towards each other,
a driving motor configured to move the pair of gripping sections,
a detector configured to detect a rotation angle of the driving motor or a position of the pair of the gripping sections, and
a motor control section configured to perform position feedback control of the driving motor based on a detection signal of the detector and a position command signal from the transfer control device, and
the transfer control device is provided with
a torque monitoring section configured to monitor a value of a command torque applied to the driving motor from the motor control section, and
a gripping state determining section configured to determine that there was a change in a gripping state of the component in a case in which, with the pair of gripping sections in a state gripping the component, the command torque monitored by the torque monitoring section drops to a value smaller than a first threshold value.

2. The component mounting machine according to claim 1, wherein
the motor control section is configured to, in a case in which the command torque based on the position feedback control exceeds a torque upper limit set in accordance with a strength of the component, apply the command torque corrected to within the torque upper limit to the driving motor, and
in a state with the pair of gripping sections gripping the component, the command torque applied to the driving motor matches the torque upper limit, and
the gripping state determining section is configured to determine that there was a change in the gripping state of the component in a case in which the command torque drops from the torque upper limit to a value smaller than the first threshold value.

3. The component mounting machine according to claim 2, wherein
an interval between the pair of gripping sections at a target position based on the position command signal is set to a distance smaller than an interval between the pair of gripping sections when in the state gripping the component.

4. The component mounting machine according to claim 1, wherein
the transfer control device is configured to determine that the component being gripped by the pair of gripping sections has dropped in a case in which the command torque value being monitored by the torque monitoring section has reached a second threshold value that is smaller than the first threshold value.

5. The component mounting machine according to claim 4, wherein
the transfer control device is configured to determine that the component being gripped by the pair of gripping sections has been damaged in a case in which the command torque value being monitored by the torque monitoring section, after having dropped to a value smaller than the first threshold value, rises again without reaching the second threshold value.

* * * * *